United States Patent
Nakamura et al.

(10) Patent No.: US 6,906,949 B1
(45) Date of Patent: Jun. 14, 2005

(54) MAGNETIC ELEMENT AND MAGNETIC ELEMENT ARRAY

(75) Inventors: Shiho Nakamura, Kanagawa-ken (JP); Shigeru Haneda, Kanagawa-ken (JP); Hiroaki Yoda, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 188 days.

(21) Appl. No.: 10/401,865

(22) Filed: Mar. 31, 2003

(51) Int. Cl.[7] .............................................. G11C 11/15
(52) U.S. Cl. ....................................... 365/173; 365/158
(58) Field of Search .................................. 365/173, 158

(56) References Cited

U.S. PATENT DOCUMENTS 6,111,784 A * 8/2000 Nishimura ................... 365/173
6,259,586 B1 * 7/2001 Gill ............................. 365/173
6,730,949 B2 * 5/2004 Kishi et al. .................. 365/158

OTHER PUBLICATIONS

U.S. Appl. No. 10/862,617, filed Jun. 8, 2004, Nagase et al.
U.S. Appl. No. 10/721,549, filed Nov. 26, 2003, Nakamura et al.

* cited by examiner

*Primary Examiner*—Richard Elms
*Assistant Examiner*—Tuan T. Nguyen
(74) *Attorney, Agent, or Firm*—Oblon, Spivak, McClelland, Maier & Neustadt, P.C.

(57) ABSTRACT

A magnetic element comprises a first magnetic reference part (A) including a first ferromagnetic substance pinned in magnetization (M1) substantially in a first direction, a second magnetic reference part (E) including a second ferromagnetic substance pinned in magnetization (M3) substantially in a second direction, and a magnetic recording part (C) provided between the first and second magnetic reference parts. The magnetic recording part includes a third ferromagnetic substance. A spin transfer intermediate part (B) is provided between the first magnetic reference part and the magnetic recording part. An intermediate part (D) is provided between the second magnetic reference part and the magnetic recording part. A magnetization (M2) of the third ferromagnetic substance can be directed in a direction parallel or anti-parallel to the first direction by passing a writing current between the first magnetic reference part and the magnetic recording part. A relative relation between the second direction and the direction of the magnetization of the third ferromagnetic substance can be detected by passing a sense current between the second magnetic reference part and the magnetic recording part.

20 Claims, 17 Drawing Sheets

US 6,906,949 B1

MAGNETIC ELEMENT AND MAGNETIC ELEMENT ARRAY

CROSS-REFERENCE TO RELATED APPLICATIONS

This application is based upon and claims the benefit of priority from the prior Japanese Patent Application No. 2002-096345, filed on Mar. 29, 2002; the entire contents of which are incorporated herein by reference.

BACKGROUND OF THE INVENTION

This invention relates to a magnetic element and a magnetic-element array. More particularly, the invention relates to a magnetic element in which a recording of a direct-current-driving type and a reproduction by the magnetoresistance effect are possible, and a magnetic element array.

Since the discovery that giant magnetoresistance effect (MR) is exhibited when a current is supplied to flow in parallel with the major plane of a multi-layered structure, efforts have been paid to find systems having still larger magnetoresistance ratios. Heretofore, ferromagnetic tunnel junction elements and CPP (current-perpendicular-to-plane) type MR elements in which electric current flows vertically in a multi-layered structure have been developed and regarded hopeful as magnetic sensors and reproducing elements of for magnetic recording.

Recently, "magnetic nanocontacts" by tip-to-tip abutment of two nickel (Ni) needles and nanocontacts by contact of two magnetite elements were reported as elements exhibiting 100% or higher magnetoresistance effects in the literatures, (1) N. Garcia, M. Munoz and Y. W. Zhao, Physical Review Letters, vol.82, p2923 (1999) and (2) J. J. Versluijs, M. A. Bari and J. M. D. Coey, Physical Review Letters, vol. 87, p26601-1 (2001), respectively.

These nanocontacts certainly exhibit large magnetoresistance changes. In both proposals, however, the magnetic nanocontacts are made by bringing two needle-shaped or triangular-section-shaped ferromagnetic elements into tip-to-tip contact. Furthermore, it is as a system which shows the bigger magnetoresistance effect.

These magnetoresistance effect elements can be used not only as a reproduction element of a magnetic sensor or a magnetic record reproduction system, but also as an element of a non-volatile magnetic memory.

When the magnetoresistance effect element is used as a magnetic element, therefore, writing is carried out by a leak current magnetic field applied from a wiring provided near the magnetoresistance effect element. However, there is a problem that current required to cause the magnetization reversal for recording is as large as several micro amperes or more.

On the other hand, as a new mechanism of a magnetization reversal, a magnetization reversal of a "direct-current-driving" type has been found, where the magnetization reversal for recording can be carried out by flowing a current directly to the recording magnetic part of the element (J. C. Slonczewski, J. Magn. Magn. Mater. 159, L1 (1996), E. B. Myers, et al., Science 285, 867(1999), J. A. Katine, et al., Phys. Rev. Lett., 14, 3149 (2000), F. J. Albert, et al., Appl. Phy. Lett., 77, 3809 (2000), J. E. Wegrowe, et al., Europhys. Lett., 45, 626 (1999), J. Z. Sun, J. Magn. Magn. Mater., 202, 157 (1999))

In this mechanism, when a writing current is passed through a magnetic reference part or a surrounding magnetic layer, the spin of the current is polarized. When this spin-polarized passes through the magnetic recording part, magnetization of the recording magnetic part is reversed by transmitting the anglar momentum of the spin-polarized electron to the anglar momentum of the magnetic recording part. By using this mechanism, it is expected that current required for magnetization reversal for writing decreases, since it is possible to make the writing action more directly to the recording layer.

So far, such a magnetic element of direct-current-driving type has been a device that is discrete and different from the magnetoresistance effect element. The inventors have first conceived that by combining these different elements, a novel and convenient magnetic element could be realized, by which both recording and reproducing can be performed while reducing the clement size.

However, since resistance of the recording part including the magnetic recording part is very small, it is difficult to simply combine such a direct-current-driving type magnetic element with a conventional magnetoresistance effect clement which may have a far larger resistance. Besides, since resistance of the recording part is very small, a selection of a specific element in an element array becomes especially difficult.

As explained above, although a reduction in the writing current is expected with a magnetic element using the direct-current-driving magnetization reversal, there is a problem that it is difficult to make element selection when the elements are integrate in an array configuration.

SUMMARY OF THE INVENTION

According to an embodiment of the invention, there is provided a magnetic element comprising: a first magnetic reference part including a first ferromagnetic substance pinned in magnetization substantially in a first direction; a second magnetic reference part including a second ferromagnetic substance pinned in magnetization substantially in a second direction; a magnetic recording part provided between the first and second magnetic reference parts, and including a third ferromagnetic substance; a spin transfer intermediate part provided between the first magnetic reference part and the magnetic recording part; and an intermediate part provided between the second magnetic reference part and the magnetic recording part, wherein a magnetization of the third ferromagnetic substance being directed in a direction parallel or anti-parallel to the first direction by passing a writing current between the first magnetic reference part and the magnetic recording part, and wherein a relative relation between the second direction and the direction of the magnetization of the third ferromagnetic substance being detected by passing a sense current between the second magnetic reference part and the magnetic recording part.

According to an embodiment of the invention, there is provided a magnetic element comprising: a first magnetic reference part including a first ferromagnetic substance pinned in magnetization substantially in a first direction; a second magnetic reference part including a second ferromagnetic substance pinned in magnetization substantially in a second direction; an Intermediate part provided between the first and second magnetic reference parts, a first magnetic recording part provided between the first magnetic reference part and the intermediate part, and including a third ferromagnetic substance; a second magnetic recording part provided between the second magnetic reference part and the intermediate part, and including a fourth ferromagnetic substance; a first spin transfer intermediate part provided between the first magnetic reference part and the first magnetic recording part; and a second spin transfer intermediate part provided between the second magnetic reference part and the second magnetic recording part, wherein a magnetization of the third ferromagnetic substance being directed in a direction parallel or anti-parallel to the first direction by passing a first writing current between the first magnetic reference part and the first magnetic recording part, a magnetization of the fourth ferromagnetic substance being directed in a direction parallel or anti-parallel to the second direction by passing a second writing current between the second magnetic reference part and the second magnetic recording part, and a relative relation between the direction of the magnetization of the third ferromagnetic substance and the direction of the magnetization of the fourth ferromagnetic substance being detected by passing a sense current between the first and second magnetic recording parts.

According to an embodiment of the invention, there is provided a magnetic element array comprising: a plurality of magnetic elements; and a selector which selects one of the magnetic elements and passes a writing current or a sense current, each of the magnetic elements having: a first magnetic reference part including a first ferromagnetic substance pinned in magnetization substantially in a first direction; a second magnetic reference part including a second ferromagnetic substance pinned in magnetization substantially in a second direction; a magnetic recording part provided between the first and second magnetic reference parts, and including a third ferromagnetic substance; a spin transfer intermediate part provided between the first magnetic reference part and the magnetic recording part; and an intermediate part provided between the second magnetic reference part and the magnetic recording part, wherein a magnetization of the third ferromagnetic substance being directed in a direction parallel or anti-parallel to the first direction by passing a writing current between the first magnetic reference part and the magnetic recording part, and a relative relation between the second direction and the direction of the magnetization of the third ferromagnetic substance being detected by passing a sense current between the second magnetic reference part and the magnetic recording part.

According to an embodiment of the invention, there is provided a magnetic element array comprising: a plurality of magnetic elements; and a selector which selects one of the magnetic elements and passes a writing current or a sense current, each of the magnetic elements having: a first magnetic reference part including a first ferromagnetic substance pinned in magnetization substantially in a first direction; a second magnetic reference part including a second ferromagnetic substance pinned in magnetization substantially in a second direction; an intermediate part provided between the first and second magnetic reference parts, a first magnetic recording part provided between the first magnetic reference part and the intermediate part, and including a third ferromagnetic substance; a second magnetic recording part provided between the second magnetic reference part and the intermediate part, and including a fourth ferromagnetic substance; a first spin transfer intermediate part provided between the first magnetic reference part and the first magnetic recording part; and a second spin transfer intermediate part provided between the second magnetic reference part and the second magnetic recording part, a magnetization of the third ferromagnetic substance being directed in a direction parallel or anti-parallel to the first direction by passing a first writing current between the first magnetic reference part and the first magnetic recording part, a magnetization of the fourth ferromagnetic substance being directed in a direction parallel or anti-parallel to the second direction by passing a second writing current between the second magnetic reference part and the second magnetic recording part, and a relative relation between the direction of the magnetization of the third ferromagnetic substance and the direction of the magnetization of the fourth ferromagnetic substance being detected by passing a sense current between the first and second magnetic recording parts.

According to the embodiment of the invention, a magnetic element which has the recording part in which magnetization reversal by direct-current-driving is possible, and a reproduction part using the magnetoresistance effect is offered.

By using the direct-current-driving magnetization reversal, assured writing is attained with a low writing current. Moreover, the output level of the reproducing signal can be increased, since a high element impedance is obtained by using the magnetoresistance effect. Thus the recording with a low writing current and a reproduction with a high output level becomes compatible.

As the result, also when the magnetic elements are integrated in an array, cell selection becomes quite easy, and thus, a magnetic memory, various kinds of logic circuits, etc. in which high integration and reduction in power consumption are possible can be realized, and a merit on industry is great.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION

Figure 1:
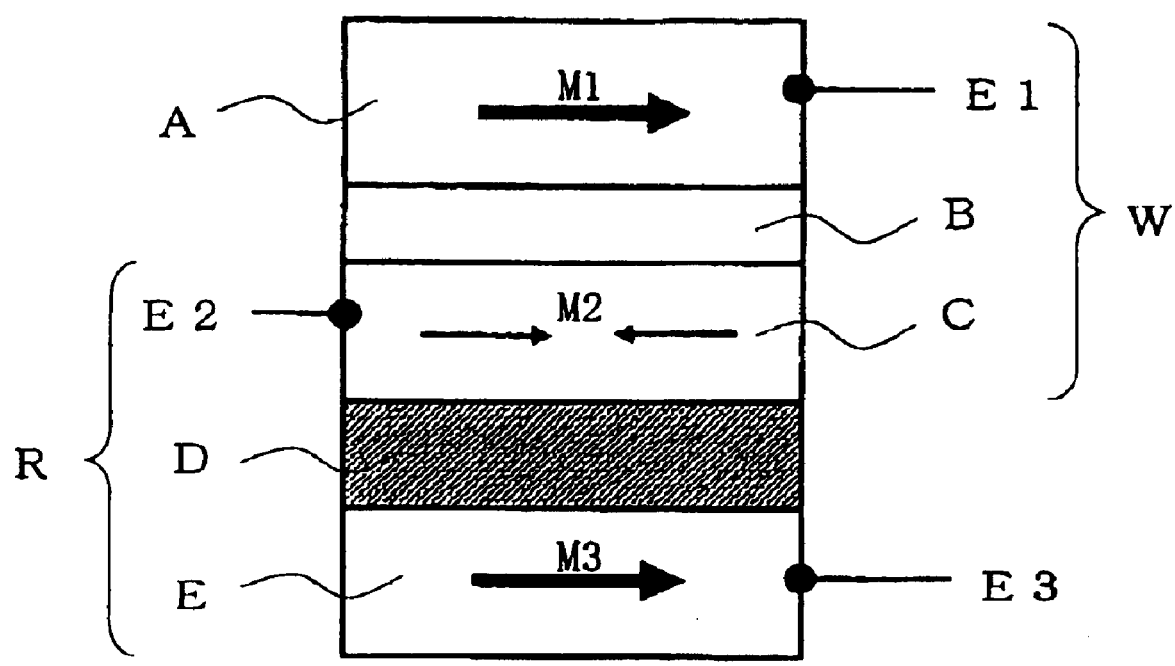
FIG. 1 is a schematic diagram which exemplifies a fundamental sectional structure of a magnetic element according to the first embodiment of the invention.

Hereafter, some embodiment of the invention will be explained, referring to the drawings.

FIG. 1 Is a schematic diagram which exemplifies fundamental sectional structure of a magnetic element concerning the first embodiment of the invention.

This magnetic element has the reproduction part R which reads according to the magnetoresistance effect, and a recording part W where writing is carried out directly by a writing current. The recording part W and the reproduction part R are sharing a recording layer C.

The recording part W has a structure where the laminating of a magnetic reference part A, a spin transfer intermediate part B, and a magnetic recording part C is carried out. The magnetic reference part A consists of a hard magnetic material. The spin transfer intermediate part B consists of a non-magnetic material. The record magnetic layer C consists of a soft magnetic material which is magnetically softer than the magnetic reference part A.

On the other hand, the reproduction part R has a magnetic recording part C, an intermediate part D and a magnetic reference part E. The magnetic reference part E consists of a hard magnetic material which is magnetically harder than the magnetic recording part C.

Electrodes E1, E2, and E3 are connected to the magnetic reference part A, the magnetic recording part C, and the magnetic reference part E, respectively. In the invention, the electrodes such as E1, E2 and E3 can be connected at any place other than the specific case shown in the figure. The intermediate part D consists of a conductive metal or an insulator. A composite structure including metal part and insulating part can also be used as the intermediate part D. For example, a structure called "granular structure" where metal particles are scattered in an insulating matrix can be employed.

In a magnetic element shown in FIG. 1, "writing" is performed in a recording part W by using a magnetization reversal mechanism of a direct-current-driving type. That is, magnetization of a magnetic recording part C is reversed by a spin-polarized current.

Figure 2A:
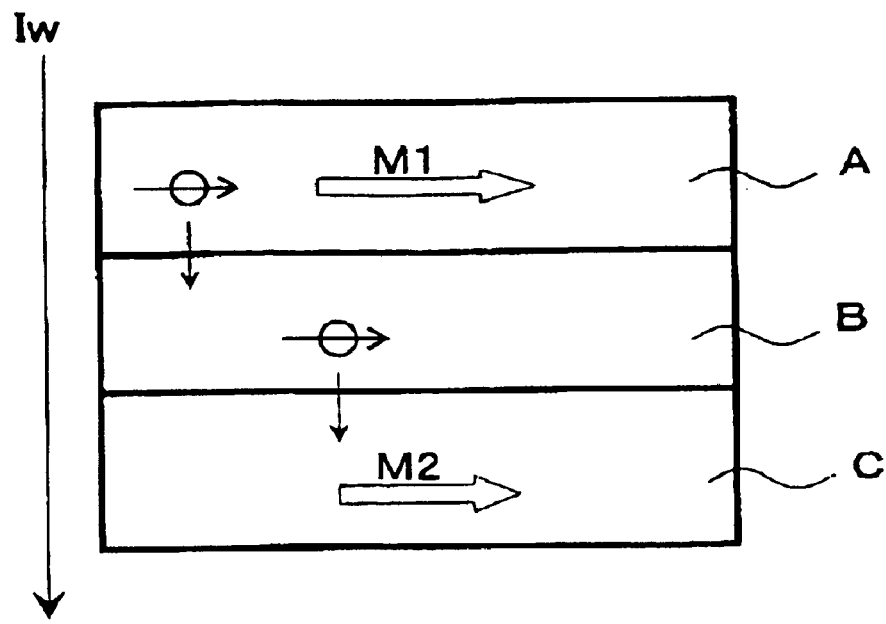
FIGS. 2A and 2B are schematic diagrams showing the operation of the recording part W in a magnetic element of the embodiment.
Figure 2B:
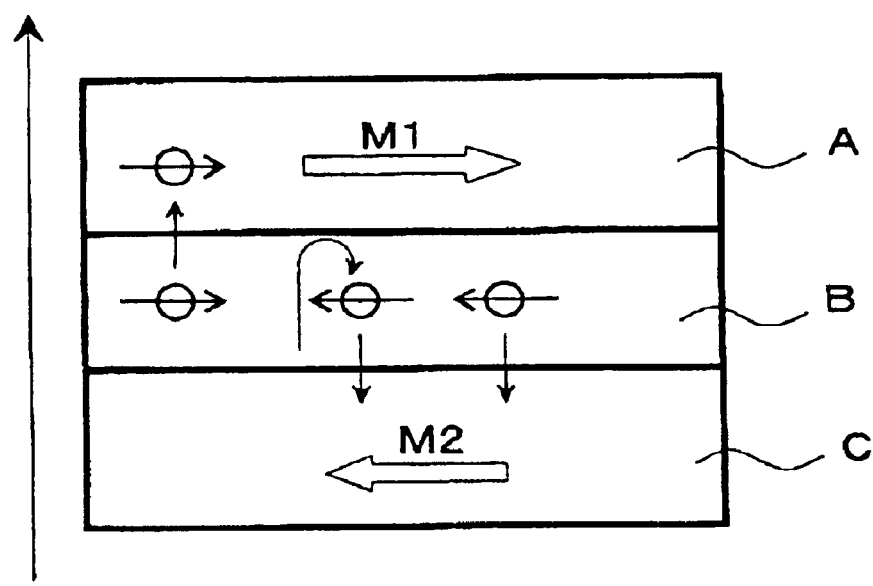

FIGS. 2A and 2B are schematic diagrams showing an operation of the recording part W in a magnetic element of the embodiment.

If a electronic current Iw is passed towards the magnetic recording part C from the magnetic reference part A as shown in FIG. 2A, writing to the magnetic recording part C is carried out according to the direction of the magnetization M1 of the magnetic reference part A. That is, when the electronic current Iw is passed in this direction, in a magnetic reference part A, a polarization of the electronic spin is first carried out according to the direction of the magnetization M1. These spin-polarized electrons flow into the magnetic recording part C, and reverse the magnetization M2 into a direction of the magnetization M1 of the magnetic reference part A.

On the other hand, if an electronic current Iw is passed towards the magnetic reference part A from the magnetic recording part C as shown in FIG. 2B, writing to the magnetic recording part C is carried out in an opposite direction. That is, electrons which have a spin corresponding to the magnetization M1 of a magnetic reference part A can pass the magnetic reference part A easily. However, electrons which have a spin opposite to the magnetization M1 are reflected at the interface between the spin transfer intermediate part B and the magnetic reference part A by a high probability. And when the spin-polarized electrons reflected in this way return to the magnetic recording part C, the magnetization M2 of the magnetic recording part C is reversed in a direction opposite to the magnetization M1 of the magnetic reference part A.

Thus, in a the embodiment, a desired magnetization can be written in the magnetic recording part C according to the magnetization reversal mechanism of a direct-current-driving type realized by a spin-polarized current. Therefore, as compared with the conventional recording element which carries out magnetization reversal of the recording layer by magnetic field generated by the current, it becomes possible to decrease current required for magnetization reversal at the time of recording.

On the other hand, in the reproduction part R in a magnetic element of this embodiment, "read-out" can be carried out by a magnetoresistance effect.

Figure 3A:
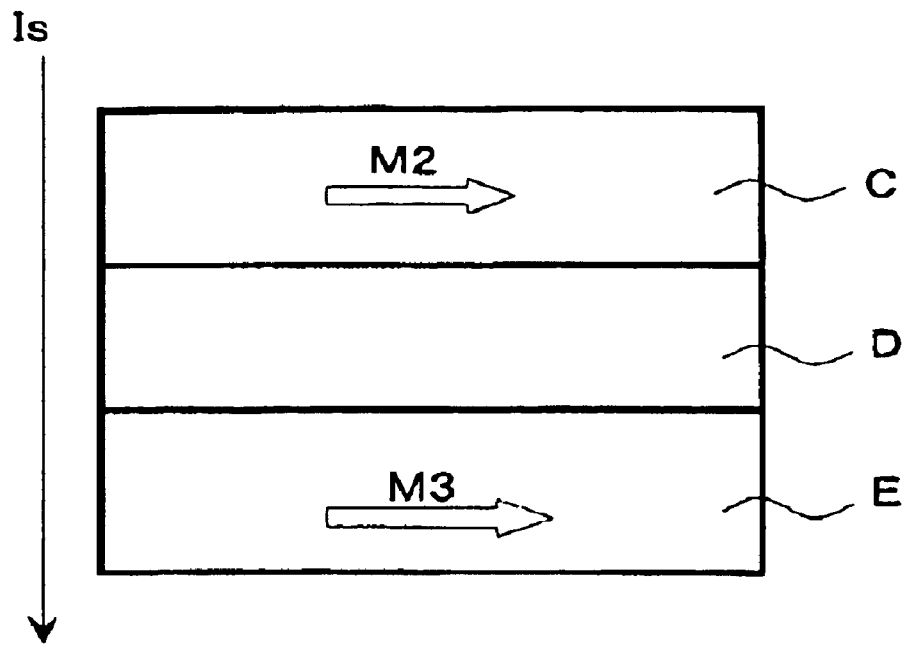
FIGS. 3A and 3B are schematic diagrams showing the operation of the reproduction part R in a magnetic clement of this embodiment.
Figure 3B:
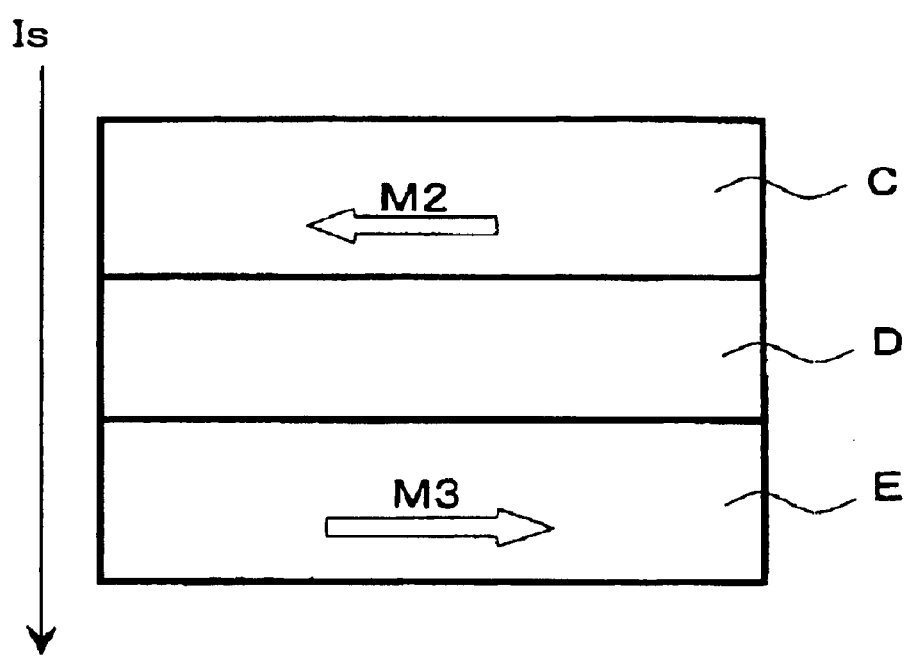

FIGS. 3A and 3B are schematic diagrams showing operation of the reproduction part R in a magnetic element of this embodiment.

As shown in FIG. 3A, when the magnetization M2 of the magnetic recording part C and the magnetization M3 of the magnetic reference part E are parallel, a resistance obtained by a sense current Is which passes in the direction shown with an arrow (or a direction contrary to this) in this figure becomes low.

On the other hand, the resistance becomes high when the magnetization M2 of the magnetic recording part C and the magnetization M3 of the magnetic reference part E are anti-parallel as shown in FIG. 3B. Therefore, reproduction of a binary information can be performed by assigning "0" level and "1" level corresponding to these resistance outputs.

In the invention, it becomes possible to reproduce magnetization of the magnetic recording part C by high sensitivity by using the magnetoresistance effect in the reproduction part R. Furthermore, resistance of a reproduction part which passes sense current Is can be made higher to an optimal level by devising the material of the intermediate part D material and the structure suitably, as will be explained in full detail later. As a result, element selection in a case where the magnetic elements are integrated in an array becomes especially easier, and a memory element or a logic circuit etc. which has the integrated array can be realized.

Next, each element which constitutes the magnetic element of the embodiment will be explained in full detail.

As the materials of the magnetic reference parts A and E and the record magnetic layer C, a magnetic materials such as an element among iron (Fe), cobalt (Co), and nickel (Ni), etc. can be used. Alternatively an alloy containing at least one element among iron (Fe), cobalt (Co), nickel (Ni), manganese (Mn) and chromium (Cr) can be used. Furthermore, a NiFe-family alloy called "Permalloy" can be used. Furthermore, a soft magnetic material such as a CoNbZr-family alloy, a FeTaC-family alloy, a CoTaZr-family alloy, a FeAlSi-family alloy, a FeB-family alloy, a CoFeB-family alloy, or the like can be used. Furthermore, a half-metal magnetic material such as a Heusler alloy, $CrO_2$, $Fe_3O_4$, or $La_{1-x}Sr_xMnO_3$ can be used. Alternatively, the magnetic reference parts A and E and the record magnetic layer C can be made of a compound semiconductor or oxide semiconductor containing at least one magnetic element among iron (Fe), cobalt (Co), nickel (Ni), manganese (Mn) and chromium (Cr), such as (Ga, Cr)N, (Ga, Mn)N, MnAs, CrAs, (Ga, Cr)As, ZnO:Fe, (Mg, Fe). Any of these materials having a magnetic property suitable for the intended use may be selected.

As a material used for these magnetic layer, it has a form of a continuous magnetic body. Alternatively, a composite structure where particles which consists of the magnetic body are precipitated or formed in a non-magnetic matrix can also be used.

As the magnetic recording part C, two-layered structure which consists of (Co or CoFe alloy)/(a permalloy which consists of NiFe or NiFeCo, or nickel), or three-layered structure which consists of (Co or CoFe alloy)/(permalloy which consists of NiFe or NiFeCo, or nickel)/(Co or CoFe alloy) can also be used especially.

As for the thickness of the outside Co or a CoFe alloy layers in these multi-layered structure, it is desirable to set in a range of 0.2 mn to 3 nm. The above-mentioned multi-layered structures can reduce the current for recording.

Furthermore, as the magnetic recording part C, a three-layered structure which consists of (magnetic layers, such as permalloy and CoFe-alloy)/(spin transfer intermediate parts, such as Cu and Ru (having a thickness in a range of 2 nm–3 nm))/(magnetic layers, such as permalloy and CoFe-alloy) having the interlayer exchange-coupling, especially antiferromagnetic exchange-coupling, can also be used.

When this three-layered structure is used, the switching current and the switching magnetic field can be made even smaller.

On the other hand, in order to pin the magnetization M1 of the magnetic reference part A and the magnetization M3 of the magnetic reference part E, it is effective to provide anti-ferromagnetic layers (not shown) adjoining the magnetic reference parts A and/or E, respectively, and to apply exchange bias to them.

Moreover, in order to pin the magnetization M1 of the magnetic reference part A and the magnetization M3 of the magnetic reference part E, the laminating of a spin transfer intermediate part such as ruthenium (Ru) and copper (Cu), a ferromagnetic layer and a anti-ferromagnetic layer, adjoining the magnetic reference parts A and/or E, can be used. By employing such a laminated structure, exchange bias can be applied effectively to control the magnetization, and therefore a large signal output of the magnetoresistance effect can be obtained.

Furthermore, by using the structures with antiferromagnetic coupled structures which consists of a ferromagnetic layer such as CoFe/ spin transfer intermediate part such as Ru and Cu/ a ferromagnetic layer such as CoFe/ an antiferromagnetic layer, the critical current for the writing can be small, because the stray magnetic field which makes the magnetic recording part magnetically hard becomes small.

For the above-mentioned anti-ferromagnetic material, it is desirable to use anti-ferromagnetic material such as iron manganese (FeMn), platinum manganese (PtMn), palladium manganese (PdMn), palladium platinum manganese (PdPtMn), etc.

As for the spin transfer intermediate part, it is desirable to use low electronic resistance materials such as Cu, Ag, and Au.

Figure 4:
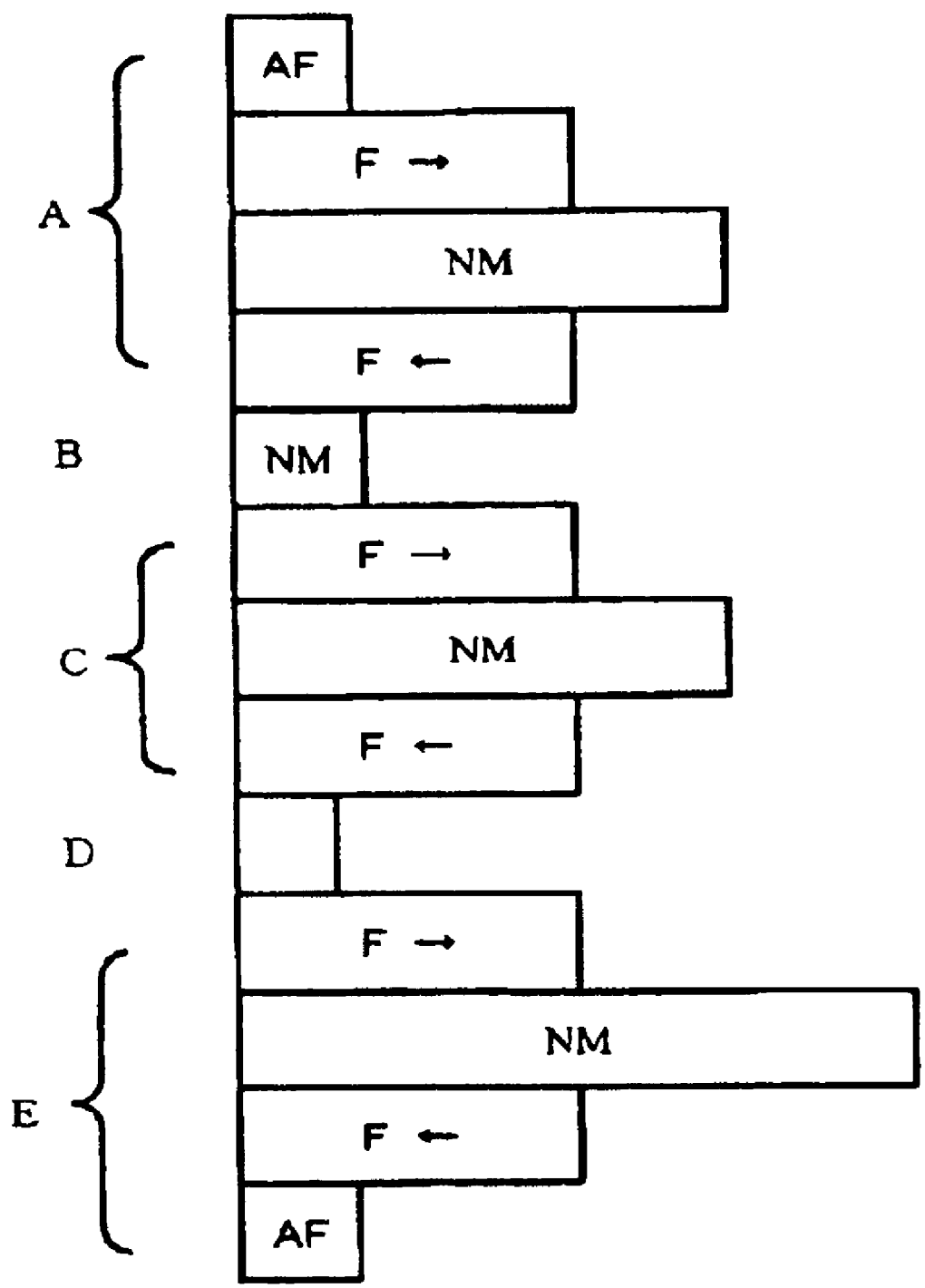
FIG. 4 is a schematic sectional view showing another example of the magnetic clement of the embodiment.

FIG. 4 is a schematic diagram showing the section of the magnetic element where each part has a mulilayered structure.

As shown in the figure, the reference magnetic part A, the recording magnetic part C, and the reference magnetic part E can be formed by suitably combining the anti-ferromagnetic substance AF, a ferromagnetic substance F, and the nonmagnetic material film NM, respectively.
Antiferromagnetic coupling is formed in each laminated structure.

The direction of magnetization of the ferromagnetic substance F is also shown with the arrow in FIG. 4.

The spin transfer intermediate part B has the role to suppress the magnetic coupling between the reference magnetic part A and the recording magnetic part C.

The spin transfer intermediate part B also has a role to pass the spin-polarized electrons.

The intermediate part B can be formed by the following material.

(1) a metal consisting of a non-magnetic precious-metals element such as Cu, Ag, and Au, or a metal which includes at least one of these elements.

(2) a material which consists of the same magnetic element as the soft magnetic part and/or reference magnetic part HM, and further having a portion including crystal defects, or surface unevenness so that magnetic domains are trapped.

The above-mentioned crystal defects can be introduced by an electron irradiation or an ion irradiation. The surface unevenness can be formed by a providing a constriction on a thin line matrix, for example.

As a material of the intermediate part B, it is preferable to use a low resistance material such as copper (Cu), silver (Ag), and gold (Au).

On the other hand, as a material of the intermediate part D, insulators which consist of an oxide, a nitride or an fluoride can be used. These oxide, nitride and fluoride may include at least one element chosen from a group which consists of aluminum (Al), titanium (Ti), tantalum (Ta), cobalt (Co), nickel (nickel), silicon (Si), and iron (Fe). Alternatively, as the material of the intermediate part D, copper (Cu), gold (Au), silver (Ag), or an alloy containing at least one of these elements can also be used.

In order to make element resistance of a reproduction part higher to obtain a high reproduction signal, it is effective to use an insulating material as the material of the intermediate part D.

As for the thicknesses of the magnetic reference parts A and E, it is desirable to set them within a range from 0.6 nm to 100 nm. As for the thickness of the magnetic recording part C, it is desirable to set it within a range from 0.2 nm to 50 nm. Moreover, as for the thickness of the spin transfer intermediate part B, it is desirable to set it within a range from 0.2 nm to 100 nm. Furthermore, as for the thickness of the intermediate part D, it is desirable to set it within a range from 0.2 nm to 10 nm.

It is preferable to form the record magnetic part C, the reference magnetic part E and the intermediate part D into a film form or a thin line form, to make the fabrication thereof easier.

On the other hand, as for the plane shape of the magnetic element, for example, it is desirable to make the plane shape of the record magnetic layer C to form into a rectangular, a rhomboid or an elongated hexagonal shape. As for the aspect ratio, it is desirable to set it in a range about from 1:1 to 1:5 so that a uniaxial magnetic anisotropy can be surely exhibited.

Figure 5:
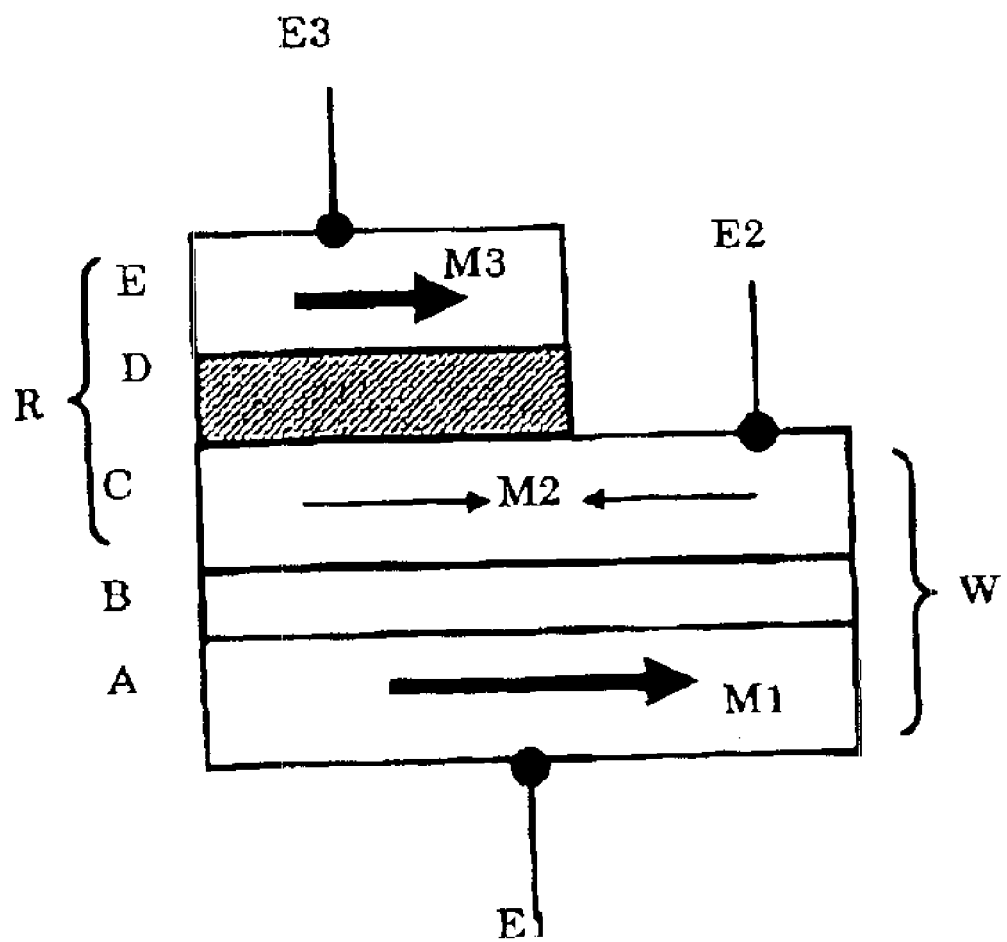
FIG. 5 is a schematic sectional view showing another example of the solid-state magnetic element of the embodiment.

Moreover, as for the size of the magnetic recording part C, it is desirable to set the longer side thereof in a range from 5 nm to about 1000 nm, Although the widths of magnetic reference parts A and E and the magnetic recording part C are shown to be same in the figures, the invention is not limited to these specific examples. That is, widths of these layers may differ in order to provide wirings or control the direction of the magnetization, as shown in FIG. 5.

FIGS. 6A through 6D are schematic sectional views showing other examples of the magnetic element of the embodiment. The same symbols are given to the similar elements as what were mentioned above with reference to FIGS. 1 through 5, and detailed explanation is omitted.

Each example has the "point contact" P in the intermediate part D. The "point contact" P is a magnetic nanocontact where a contact area is equal to or smaller than 100 $nm^2$. This magnetic nanocontact P consists of material of a magnetic reference part E or a magnetic recording part C, and the circumference is covered by insulator in an intermediate part D.

Figure 6A:
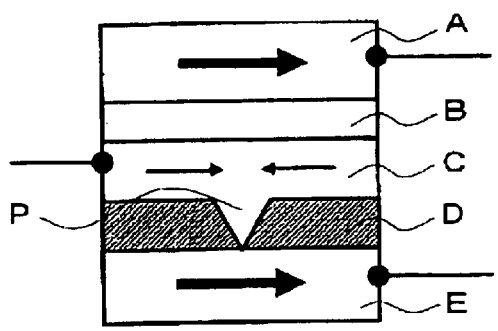
FIGS. 6A through 6D are schematic sectional views showing other examples of the solid-state magnetic element of the embodiment.
Figure 6C:
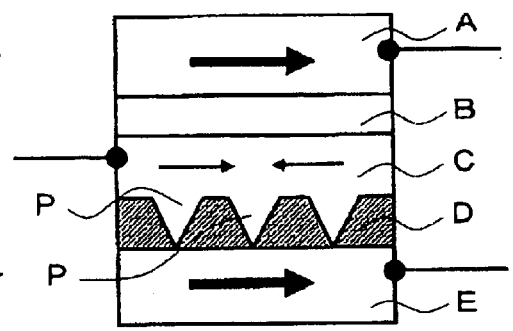
Figure 6B:
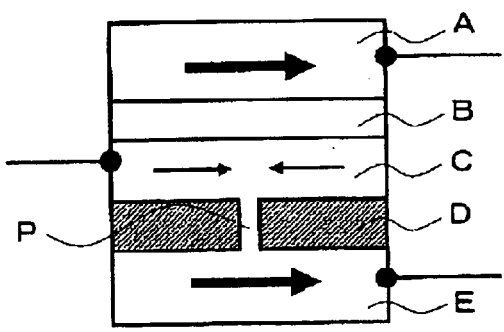
Figure 6D:
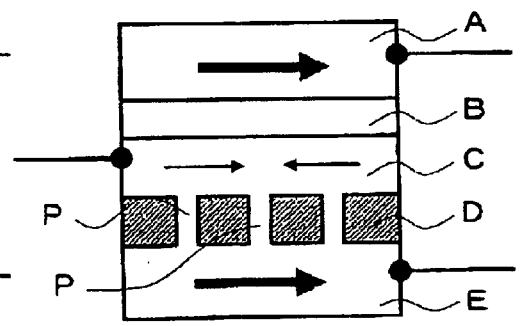

The magnetic nanocontact P may have a corn-lie section as exemplified in FIG. 6A, or it may have a pillar-like section as exemplified in FIG. 6B. Furthermore, as exemplified in FIGS. 6C and 6D, two or more magnetic nanocontacts P may be formed.

If the miniaturization of the size of such a magnetic nanocontact P is carried out, decrease in resistance is observed when a magnetic field is applied thereto. A critical size of the nanocontact P at which such a decrease in resistance is observed depends on a shape of the section of the nanocontact P. However, according to the result of examination of the Inventors, it has become clear that the decrease in resistance becomes remarkable when the maximum width of the nanocontact P is set to about 20 nm or less. By setting the size of the nanocontact P within this range, a big magnetoresistance effect where a magnetoresistance rate of change becomes 20% or more can be obtained. However, when section shape of the nanocontact P is extremely elongated, even if the maximum width exceeds 20 nm, a decrease of resistance by application of a magnetic field may arise a magnetic element which has such a magnetic nanocontact P is also included within the range of the invention.

That is, by forming such a magnetic nanocontact P in the reproduction part R, it becomes possible to read magnetization of a magnetic recording part C by very high sensitivity.

When forming such a magnetic nanocontact P, the intermediate part D may be formed by an insulating material so that the nanocontact P is surrounded by the insulating material. In such a case the thickness of the intermediate part D may be increased up to about 1000 nm.

The nanocontact P can be also made of a material other than the record magnetic part C and the reference magnetic part E. For example, the nanocontact P can be formed by copper (Cu). In this case, the nanocontact P is made of copper and its surroundings are made of an insulating material such as aluminum oxide. Since the current path can be narrowed, it becomes possible to increase the sensitivity as compared with a normal type CPP-GMR element.

Figure 7A:
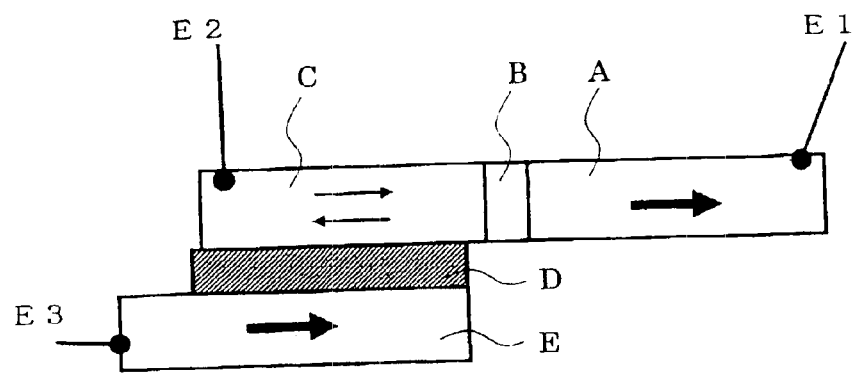
FIGS. 7A and 7B are schematic sectional views showing other examples of the magnetic element of the embodiment.

FIG. 7A is a schematic sectional view showing another example of the magnetic element of the embodiment. The same symbols are given to the similar elements as what were mentioned above with reference to FIGS. 1 through 6D about this figure, and detailed explanation is omitted.

In this example, the laminating of the soft magnetic layer C and the hard magnetic layer E is carried out to upper and lower sides of the intermediate part D, respectively. However, the hard magnetic layer A and the spin transfer intermediate part B are adjoining in a lateral direction, while these layers are laminated in the example shown in FIG. 1. That is, the spin transfer intermediate part B and the hard magnetic layer A are adjoining the soft magnetic layer C in a lateral direction, without being laminated in a direction of the thickness.

When each layer of a magnetic element is arranged in such an arrangement, input operation by spin-polarized current mentioned above with reference to FIGS. 2A and 2B and output operation by the magnetoresistance effect mentioned above with reference to FIGS. 3A and 3B can be performed similarly.

Moreover, although an intermediate part SP may be a single insulating layer, by forming one or more magnetic nanocontacts P as exemplified in FIGS. 6A through 6D, the same effect as mentioned above with reference to FIGS. 6A through 6D can be obtained.

Figure 7B:
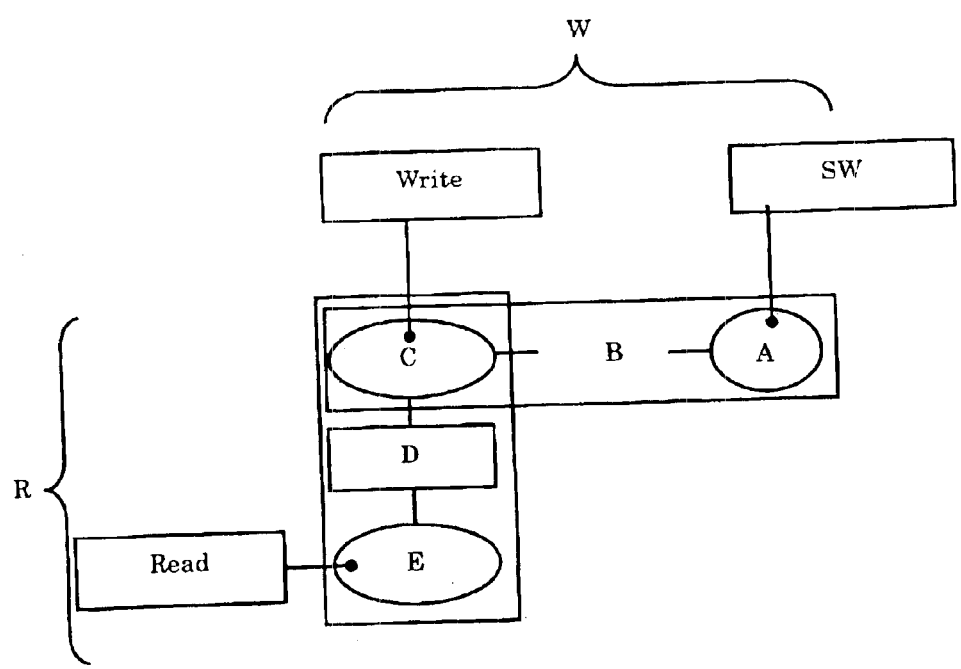

FIG. 7B is a schematic diagram which shows a example of a practical form of the solid-state magnetic element of FIG. 7A. That is, an electrode E1 is connected to the switching element SW, an electrode E2 is connected to writing wiring, and an electrode E3 is connected to reading wiring.

The switching element SW is turned ON and it can be recorded by passing a writing current for the course from the switching part SW to the writing wiring. On the other hand, the switching element SW is turned ON and read-out is possible by passing a sense current for the course from the switching part SW to the reading wiring.

In the examples shown in FIGS. 1 through 7B, although the magnetizations of the magnetic reference parts in a magnetic element were shown to have the same direction, the invention is not limited to these specific examples. That is, the magnetization directions of the magnetic reference parts in a magnetic element may be anti-parallel or substantially perpendicular to each other.

As explained above with reference to FIGS. 1 through 5, a magnetic element of a the invention can write magnetization M2 in a magnetic recording part C with small write-in current by spin-polarized current in a recording part W, and can read the magnetization M2 of a magnetic recording part C by high sensitivity in the reproduction part R using a magnetoresistance effect.

Furthermore, the impedance of the reproduction part R, i.e., element resistance, can be made higher to optimal range, and this effect is especially advantageous when the elements are integrated in an array.

Next explained is a structure where the magnetic elements of the embodiment are integrated in an array.

Figure 8:
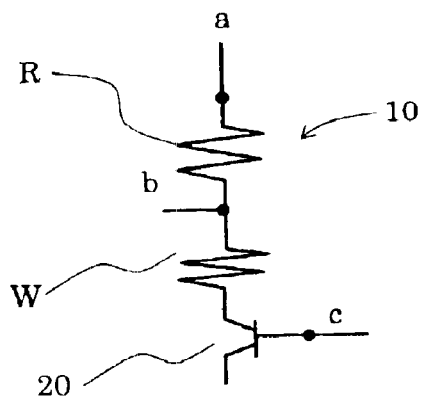
FIG. 8 Is a schematic diagram showing an equivalent circuit of a cell which constitutes a magnetic element array according to an embodiment of the invention.

FIG. 8 is a schematic diagram showing an equivalent circuit of a cell which constitutes a magnetic element array according to an embodiment of the invention. That is, the cell of the array of the embodiment has the magnetic element 10 mentioned above with reference to FIGS. 1 through 7B, and the switching part 20 for selecting this element and passing a current.

The magnetic element 10 has a recording part W which writes in by passing current as mentioned above and the reproduction part R which shares the magnetic recording part C of the recording part W and reads by a magnetoresistance effect.

The recording part W is provided between the reproduction part R and the switching part 20, and the wiring WL2 for writing is connected between the reproduction part R and the recording part W. According to this structure, writing becomes possible by turning on the switching part 20 and passing current between b–c. Moreover, a switching part can be turned on so that a current can be passed between a–c, and thus, read out becomes possible by detecting resistance (or voltage) between a–c. That is, b is connected to the wiring WL2 for writing.

This unique connection relation has been devised by considering that the resistance of a recording part W is small compared with the resistance of the reproduction part R. If the positional relation between the recording part W and the reproduction part R becomes reverse to the one shown in FIG. 8, it becomes impossible to pass a sufficient current for magnetization reversal to the recording part W, since the reproduction part R has a large resistance.

In order to avoid this, the recording part W is provided between the reproduction part R and the switching part 20, and the wiring WL2 for writing is connected between the reproduction part R and the recording part W. By employing this unique configuration, it becomes possible to select a desired cell for writing and read-out by one switching part 20, and structure of the integrated array can be sharply made simple.

Figure 9:
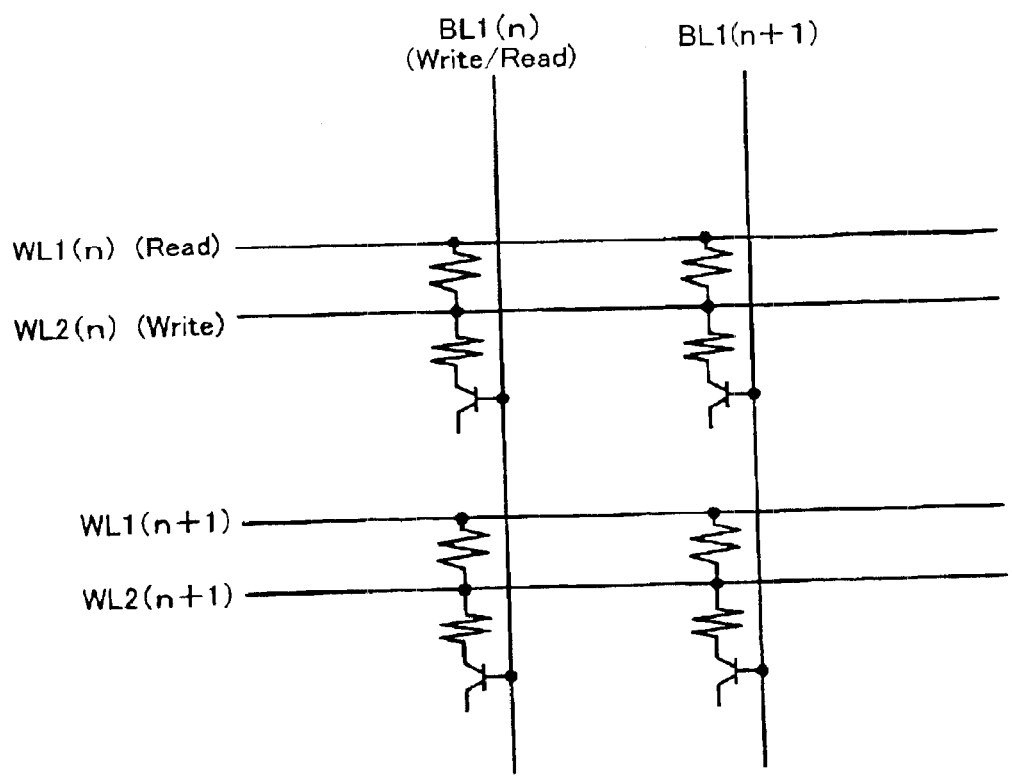
FIG. 9 is a schematic circuit diagram showing a part of a magnetic element array according to an embodiment of the invention.

FIG. 9 is a schematic circuit diagram showing a part of magnetic element array according to an embodiment of the invention. Namely, this element array has a structure where a plurality of cells, each of which is exemplified in FIG. 8, are connected in a matrix fashion, and this array can be used as a magnetic memory, for example. The wiring WL2 for writing shown in FIG. 8, the wiring WL1 for reproduction parallel to the WL2, and the wiring BL1 for cell selection which intersects perpendicularly with WL1 and WL2 are shared between the cells.

According to this structure, it becomes possible to select a desired cell and to read and write data, by using the word lines (WL1, WL2) and the bit line (BL1) corresponding to the address of the specific cell.

Figure 10:
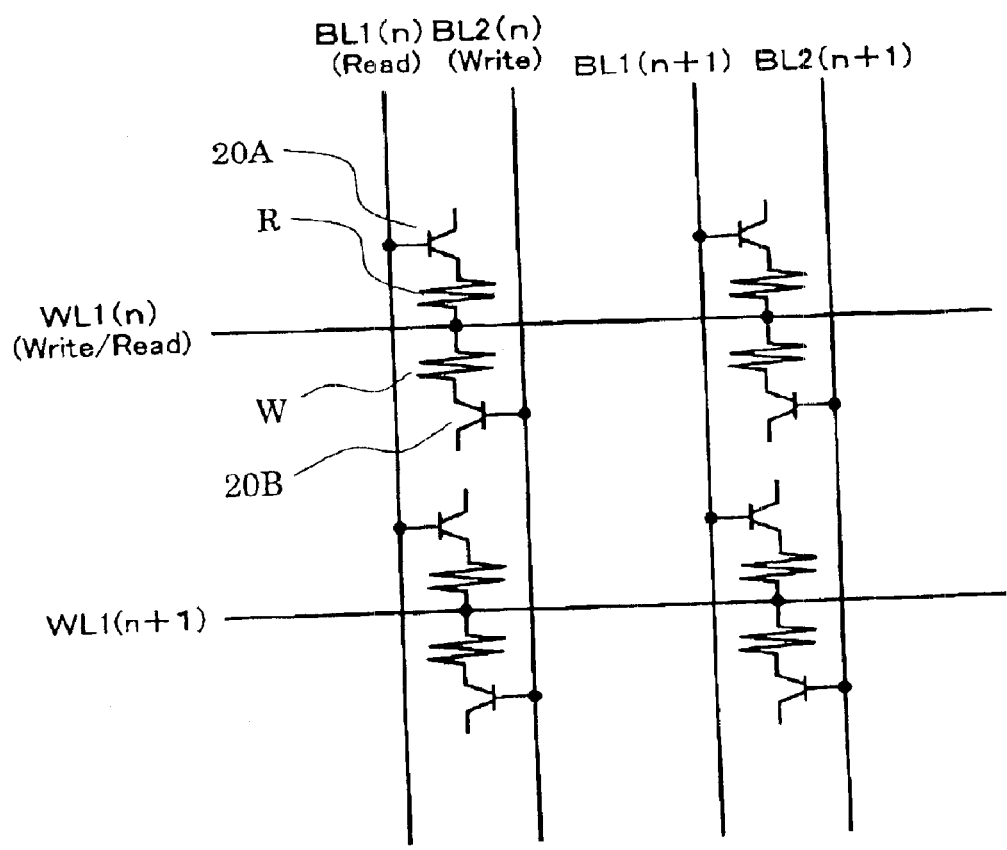
FIG. 10 is a schematic circuit diagram showing another example of a magnetic element array according to an embodiment of the invention.

FIG. 10 is a schematic circuit diagram showing another example of a magnetic element array according to an embodiment of the invention. This example can also be used as a magnetic memory.

In the case of this example, switching part 20A is connected to the reproduction part R, and switching part 20B is connected to a recording part W. And the wiring WL1 for writing is connected between the reproduction part R and a recording part W. Switching part 20A is turned on by wiring BL1, and switching part 20B is turned on by wiring BL2.

In the case of this array, read out can be performed by selecting the reproduction part R of a desired cell by switching part 20A and wiring WL1. Moreover, writing can be performed by selecting the recording part W of the desired cell by switching part 20B and wiring WL1. In the above, a magnetic element and its examples of application has been explained as the first embodiment of the invention, referring to FIGS. 1 through 9.

Next, the second embodiment of the invention will be explained.

Figure 11:
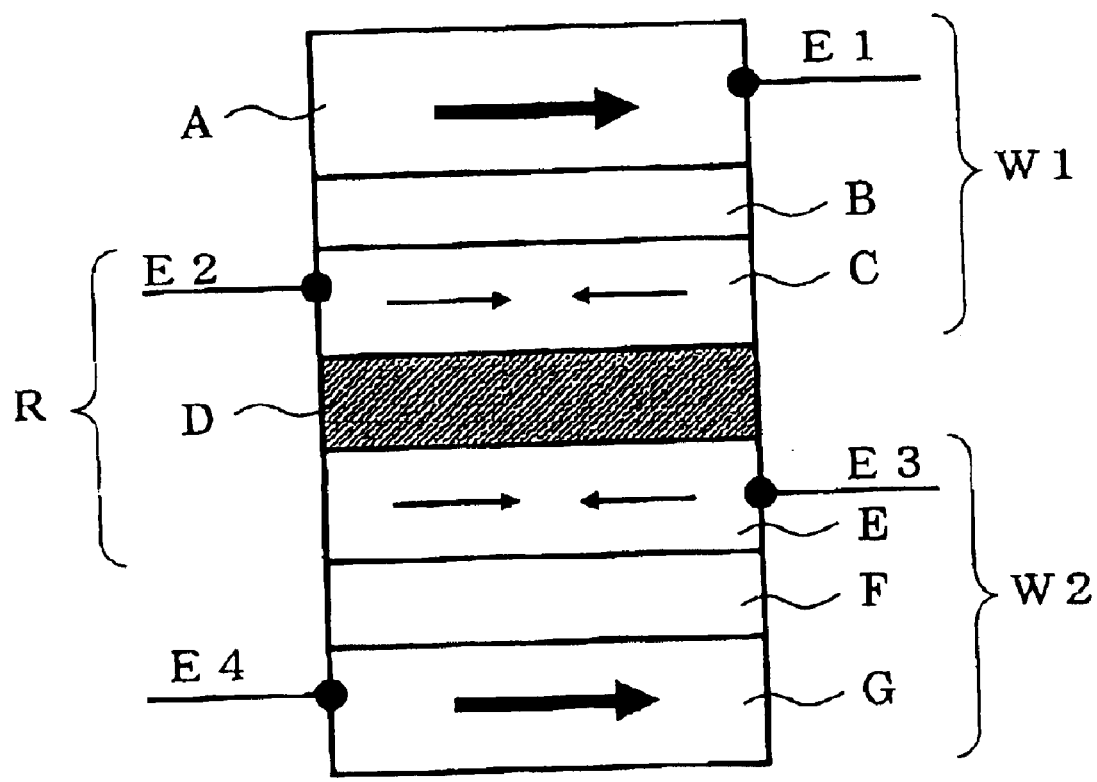
FIG. 11 is a schematic diagram showing a sectional structure of a magnetic element according to the second embodiment of the invention.

FIG. 11 is a schematic diagram showing section structure of a magnetic element concerning the second embodiment of the invention. The magnetic element of this embodiment has the reproduction part R in the central part, and two recording parts W1 and W2 so that magnetic recording parts may be shared on the both sides with the reproduction part R, respectively.

This example has a multi-layered structure where a laminating of a magnetic reference part A, the spin transfer intermediate part B, a magnetic recording part C, an intermediate part D, a magnetic recording part E, the spin transfer intermediate part F, and the magnetic reference part G is carried out in this order.

The recording part W1 is constituted by the magnetic reference part A, the spin transfer intermediate part B and the magnetic recording part C. The reproduction part R is constituted by the magnetic recording part C, the intermediate part D and the magnetic recording part E. The recording part W2 is constituted by the magnetic recording part E, the spin transfer intermediate part F and the magnetic reference part G.

Materials, thicknesses, sizes, etc. of these layers may be the same as that of what was mentioned above about the first embodiment.

The operation of this example now will be explained. A writing to the recording layer C is performed by passing a current among electrodes E1–E2 to reverse the magnetization of the magnetic recording part C. On the other hand, a writing to the recording layer E is performed by passing a current among electrodes E3–E4 to reverse the magnetization of the magnetic recording part E.

A mechanism of the writing process is based on a magnetization reversal mechanism of a direct-current-driving type using a spin-polarized current which was mentioned above with reference to FIGS. 2A and 2B.

On the other hand, reproduction is performed by detecting a relative angle of magnetization between the magnetic recording parts C and E as a magnetoresistance by passing a sense current among electrodes E2–3. The mechanism is the same as that of what was mentioned above with reference to FIGS. 3A and 3B.

As explained above, a magnetic element of this embodiment can store information in two magnetic recording parts independently.

FIGS. 12A through 12D are schematic sectional views showing examples of a magnetic clement of the embodiment. The same symbols are given to the similar elements as what was mentioned above with reference to FIGS. 1 through 11 about this figure, and detailed explanation is omitted.

That is, these examples have the point contact P, i.e., a magnetic nanocontact, like the elements exemplified in FIGS. 6A through 6D. As mentioned above, by forming such a minute nanocontact P, a high magnetoresistance rate of change can be obtained and it becomes possible to read magnetization recorded on magnetic recording parts C and E by very high sensitivity.

Figure 12A:
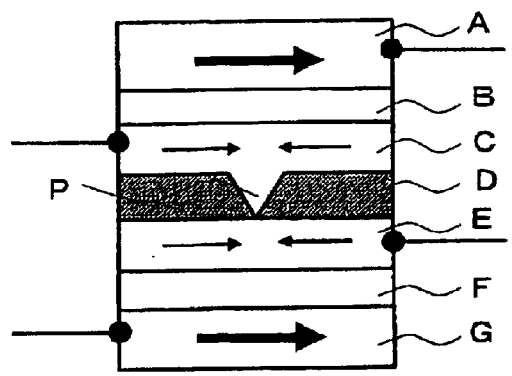
FIGS. 12A through 12D are schematic sectional views showing examples of a magnetic clement of the embodiment.
Figure 12C:
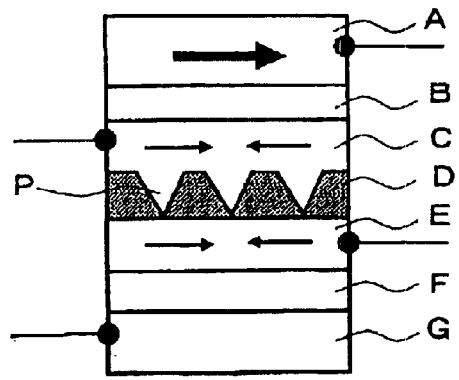
Figure 12B:
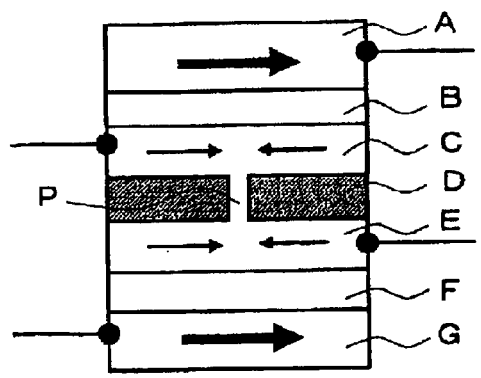
Figure 12D:
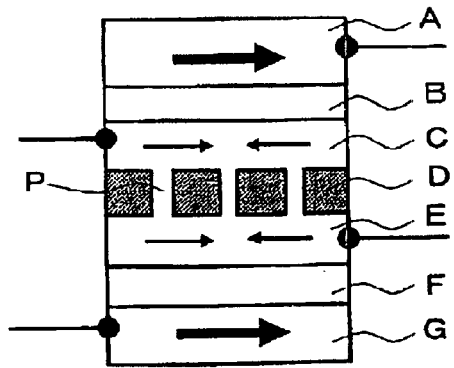

In addition, in the examples shown in FIGS. 11 through 12D, although the magnetizations of the magnetic reference parts in a magnetic element were shown to have the same direction, the invention is not limited to these specific examples. That is, the magnetization directions of the magnetic reference parts in a magnetic element may be anti-parallel or substantially perpendicular to each other.

Figure 13A:
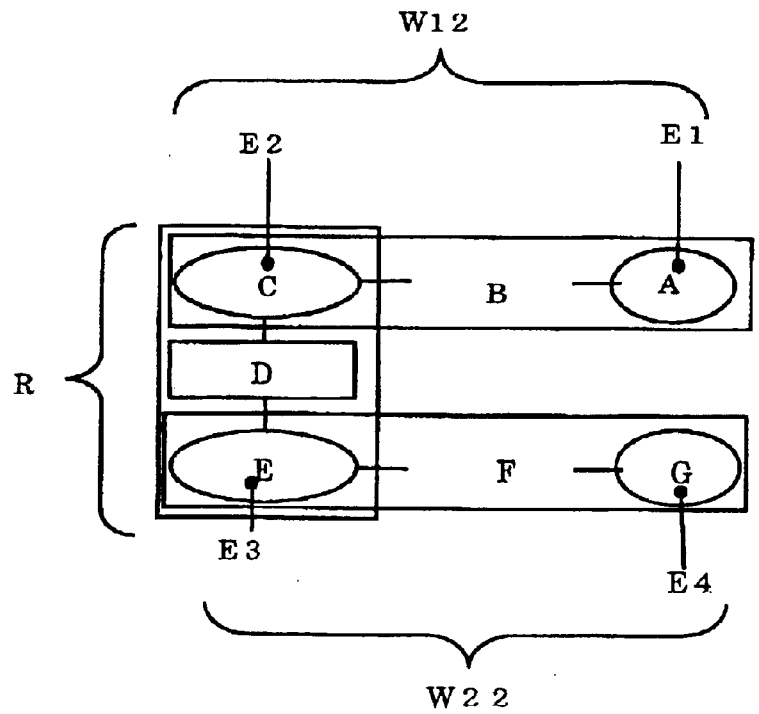
FIG. 13A is a schematic sectional view showing another example of transformation of the magnetic element of this embodiment.

FIG. 13A is a schematic sectional view showing another example of transformation of the magnetic element of this embodiment. The same symbols are given to the same elements as what were mentioned above with reference to FIGS. 1 through 12D about this figure, and detailed explanation will be omitted.

Also in this example of transformation, although the record magnetic parts C and E are laminated on top and bottom of the MR intermediate part D, respectively. The spin transfer intermediate parts B and F and the reference magnetic parts A and G are adjoined and provided in the direction of the film plane of the record magnetism parts C and E, respectively, without laminating in the direction of thickness. And an electrode E1 is connected to the reference magnetic part A, an electrode E2 is connected to the record magnetic part C, an electrode E3 is connected to the record magnetic part E, and the electrode E4 is connected to the reference magnetic part G.

In the case of such a structure, input operation by the spin-polarized current mentioned above about FIGS. 2A and 2B and output operation by the magnetoresistance effect mentioned above about FIGS. 3A and 3B can be performed similarly.

Moreover, although the MR intermediate part SP may be formed as a single insulating layer, the effect mentioned above with reference to FIGS. 6 and 12 can be similarly acquired by providing one or more magnetic nanocontacts P here.

Figure 13B:
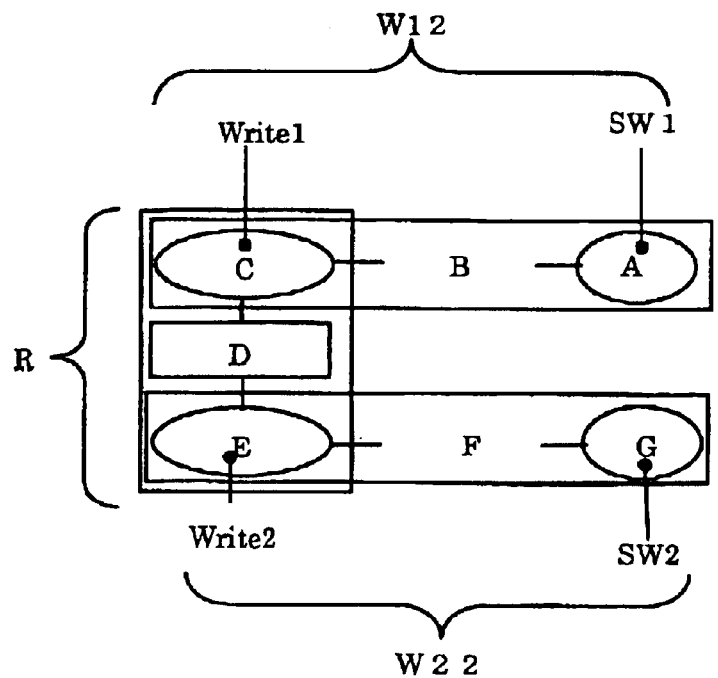
FIG. 13B is a schematic diagram which shows the use form of the magnetic element of FIG. 13A.

FIG. 13B is a schematic diagram which shows the use form of the solid-state magnetic element of FIG. 13A. That is, electrodes E1 and E4 are connected to the switching elements SW1 and SW2, respectively, and electrodes E2 and E3 are connected to the writing wirings 1 and 2, respectively. The switching element SW1 is turned ON, and magnetization of the record magnetic part C can be turned and recorded in the predetermined direction by passing current for the course from the switching part SW1 to wiring 1.

Moreover, the switching element SW2 is turned ON, and magnetization of the record magnetic part E can be turned and recorded in the predetermined direction by passing current for the course from the switching part SW2 to wiring 2.

Figure 14A:
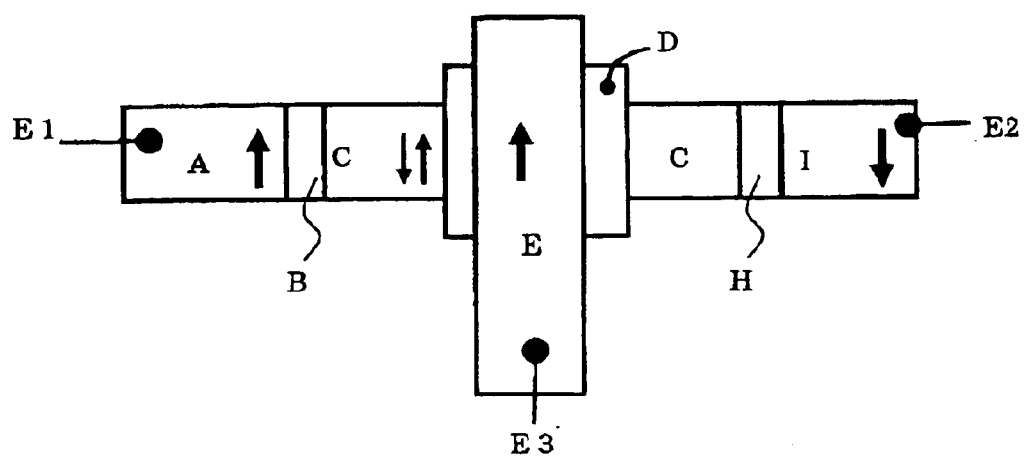
FIGS. 14A and 14B are schematic views showing another example of transformation of the solid-state magnetic element of this embodiment.
Figure 14B:
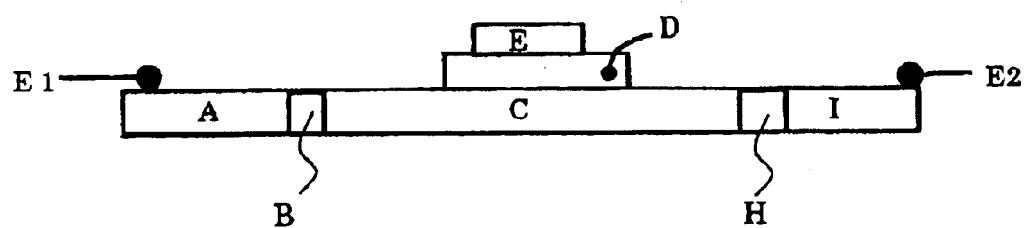

FIGS. 14A and 14B are schematic views showing another example of transformation of the solid-state magnetic element of this embodiment. That is, FIG. 14A is the plane view, and FIG. 14B is the elevational view. The same symbols are given to the same element as what were mentioned above about FIGS. 1 through 13B also about this figure, and detailed explanation will be omitted.

In this example, the reference magnetic part A, the spin transfer intermediate part B, the record magnetic part C, the spin transfer intermediate part H, and the reference magnetic part I are arranged laterally in this order. On the record magnetic part C, the MR intermediate part D is laminated and the reference magnetic part E is laminated on it The planar size of the MR intermediate part D is the same as the record magnetic part C and an overlap part with the reference magnetic part E, or needs to be larger. Therefore, the MR intermediate part D may cover the whole record magnetic part C, or may further extend to cover it to the spin transfer intermediate part B. What is necessary is just to be able to connect electrodes E1 and E2. Moreover, as for the magnetization direction of the reference magnetic part I, it is desirable to be in anti-parallel to the magnetization of the reference magnetic part A. The electrode E2 is connected to the reference magnetic part I.

Two spin transfer intermediate parts B and H enable it to turn the magnetization directions of the reference magnetic part A and the record magnetic part C, or the record magnetic part C, and the reference magnetic part I to anti-parallel, respectively.

If an electron is passed from E1 to E2 using electrodes E1 and E2, magnetization of the record magnetic part C will turn into the same direction as the reference magnetic part A. On the contrary, if electrons are passed from the electrode E2 to the electrode E1, magnetization of the record magnetic part C will turn into the same direction as the reference magnetic part I.

If a switching part, write-in wiring, and read-out wiring are connected to E1, E2, and E3, respectively, the same operation as what was mentioned above about FIG. 7B will be attained.

Figure 15A:
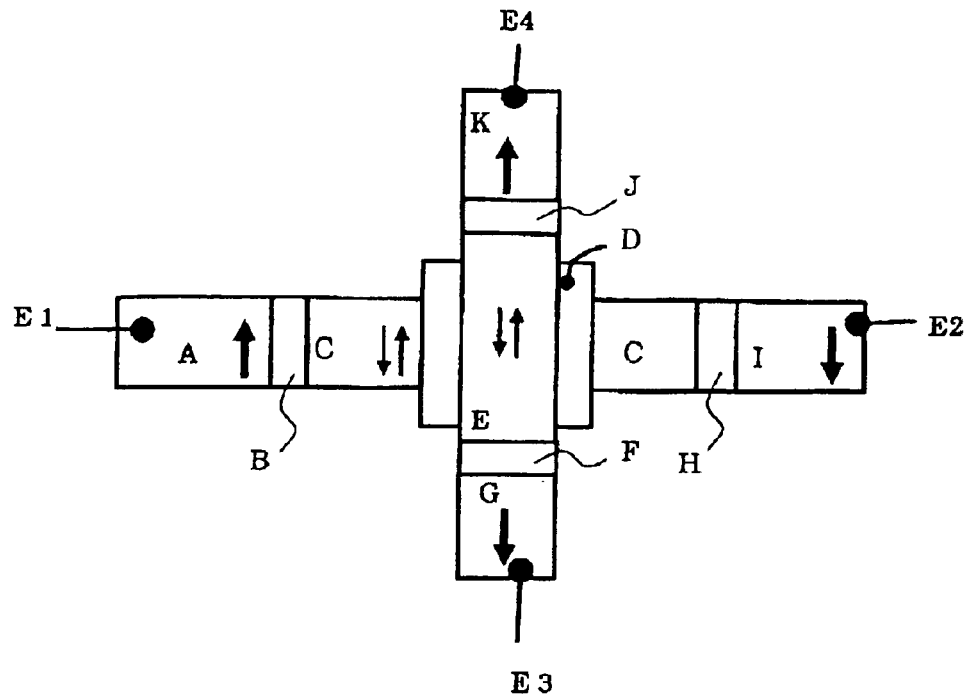
FIGS. 15A and 15B are schematic views showing another example of transformation of the solid-state magnetic element of this embodiment.
Figure 15B:
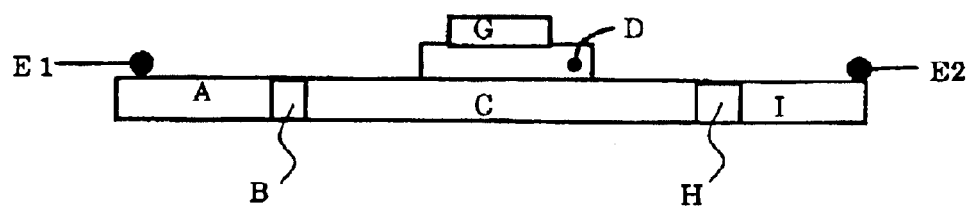

FIGS. 15A and 15B are schematic views showing another example of transformation of the solid-state magnetic element of this embodiment. That is, FIG. 15A is the plane view, and FIG. 15B is the elevational view. The same symbols are given to the same elements as what were mentioned above about FIGS. 1 through 14B also about this figure, and detailed explanation will be omitted.

In this example, the reference magnetic part A, the spin transfer intermediate part B, the record magnetic part C, the spin transfer intermediate part H, and the reference magnetic part I are arranged laterally in this order. And on the record magnetic part C, the MR intermediate part D is laminated and the record magnetism part E is further laminated on it. The reference magnetic parts G and K are arranged laterally through the spin transfer intermediate parts F and J at the both sides of the record magnetic part E, respectively.

The size of the MR intermediate part D is the same as the record magnetic part C and an overlap part with the record magnetic part E, or needs to be larger. As for the magnetization direction of the reference magnetic part G, also in this example, it is desirable to be in anti-parallel to the magnetization direction of the reference magnetic part K1. Two spin transfer intermediate parts B and H enable it to turn the magnetization directions of the reference magnetic part A and the record magnetic part C, or the record magnetic part C and the reference magnetic part I to anti-parallel, respectively.

Moreover, two spin transfer intermediate parts F and J enable it similarly to turn the magnetization directions of the reference magnetic part G and the record magnetic part E, or the record magnetic part E and the reference magnetic part K to anti-parallel, respectively.

Figure 16:
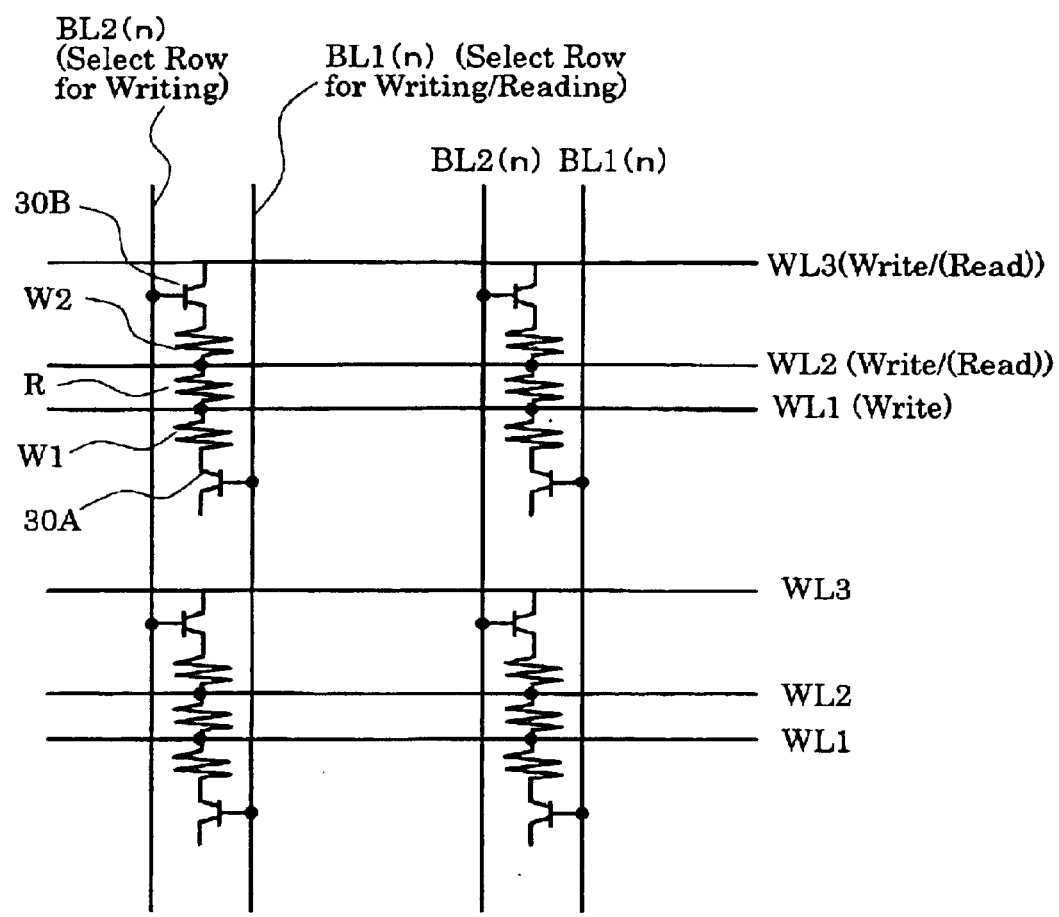
FIG. 16 is a schematic circuit diagram of a magnetic element array using a magnetic element of the embodiment.

FIG. 16 is a schematic circuit diagram of a magnetic element array using a magnetic element of this embodiment. This magnetic element array has a structure where a plurality of cells, each of which consists of a magnetic element shown in FIGS. 11 through 12D, and two switching parts 30A and 30B for selecting this element and passing current therethrough, are connected in a matrix fashion. The bit lines BL1 and BL2 are connected to the switching parts 30A and 30B, respectively. The word lines WL1 and WL2 are connected between the reproduction part R and two recording parts W1 and W2. The word line WL3 is connected to one of the switching parts 30A and 30B.

Writing is performed as follows.

First, in writing in the magnetic recording part C of a recording part W1, switching part 30A Is turned on, and a current is passed to an end (a lower end in the figure) of the switching part 30A and the wiring WL1. On the other hand, in writing to the magnetic recording part E of a recording part W2, switching part 30B is turned on, a current is passed to the word lines WL2 and W13.

On the other hand, reproduction can be performed by three kinds of methods.

The first method is to turn the switching parts 30A and 30B on, and to detect a magnetoresistance between a lower end (in the specific case shown in FIG. 16) of switching part 30A and the word line WL3.

The second method is to turn only the switching part 30A on, and to detect the magnetoresistance between the lower end (in the specific case shown in FIG. 16) of switching part 30A and the word line WL2.

The third method is to turn only the switching part 30B on, and to detect the magnetoresistance between the word lines WL1 and WL3.

In any case of the above explained methods, the resistance of the reproduction part R is detectable, since the resistance of the magnetic recording parts C and E is small.

EXAMPLES

Hereafter, embodiments of the invention will be explained in greater detail in conjunction with examples.

First Example

First, a magnetic element of the first embodiment was manufactured as the first example of the invention.

Figure 17A:
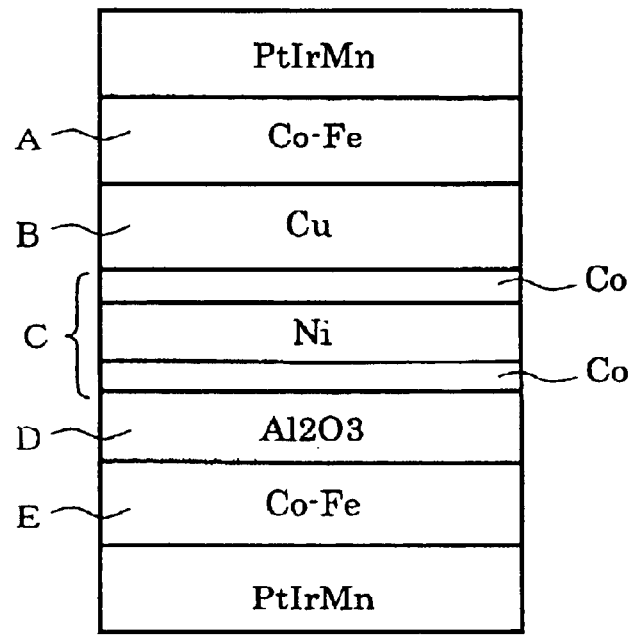
FIG. 17A and 17B are schematic diagrams showing a principal part sectional structures of magnetic elements of the example.
Figure 17B:
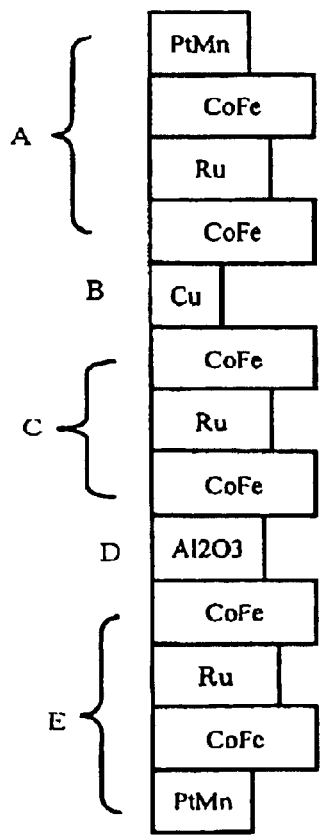

FIGS. 17A and 17B are schematic diagrams showing a principal part sectional structures of a magnetic elements of the example.

These laminated structures were produced using ultra-high vacuum sputtering equipment.

First, FETs were formed by a usual CMOS process on a Si wafer as a substrate. The bottom electrode film (not shown) which consists of tantalum (Ta) and copper (Cu) was formed on the substrate. Furthermore, the laminated structure which included the same elements as shown in FIGS. 17A and 17B were formed in a order of upside down to the figures and the upper electrode layer was formed on it. EB (electron bear) resist was applied on this laminated structure, EB exposure process was performed, and the laminated film was processed into 60 nm×240 nm size by using a lift-off process. Furthermore, EB drawing process and lift-off process were performed to remove a part of the laminated structure, thus a structure shown in the figure have been formed. Furthermore, each electrode was connected to the writing word line, the reading word line and FET, as shown in FIG. 9.

First, a transistor for switching was turned on, and minus 3 mA pulse current was passed between b–c in order to initialize the magnetization. Then, pulse current with a plus polarization was passed and magnetoresistance change between a–c was measured to detect the magnetization reversal of a magnetic recording part C.

When plus 0.2 mA write-in current was passed between b–c, value of a tunnel magnetoresistance obtained between a–c did not change and thus, magnetization reversal did not occur, for the both case of FIGS. 17A and 17B.

However, when plus 0.9 mA current was passed between b–c of the element of the type FIG. 17A, a magnetoresistance obtained between a–c of FIG. 17A showed change, and when plus 0.6 mA current was passed between b–c of the element of the type FIG. 17B, a magnetoresistance obtained between a–c of FIG. 17B showed change.

From this, it has been confirmed that a magnetization reversal has occurred in the magnetic recording part C.

Furthermore, these magnetic elements were integrated in an array in a 4×4 matrix configuration to form a magnetic element array as shown in FIG. 9. In this array structure, writing and readout were able to be performed to any desired cell by selecting the bit line BL and the word WL suitably.

Second Example

Next, a magnetic element of the second embodiment shown in FIG. 11 was manufactured as the second example of the invention. In this example, cobalt iron (CoFe) was used as the material of the magnetic reference parts A and G, nickel iron cobalt (NiFeCo) was used as the material of the magnetic recording parts C and E, and alumina was used as the material of the intermediate part D.

Furthermore, a laminating films which consist of ruthenium (Ru)/cobalt iron (CoFe)/platinum iridium manganese (PtIrMn) were provided in the outsides of magnetic reference parts A and G, respectively, and thus, an exchange anisotropy was introduced.

Thus, a magnetic element of the second embodiment can perform a logic processing with one element. That is, various kinds of logic processing including a logical product (AND), logical sum (OR), or negative of these process (NAND, NOR) can be performed with the combinations of "0" and "1" signals which are input into the magnetic recording part C and the magnetic recording part E, respectively.

Furthermore, various, still more complicated operation processing can be attained in carrying out amplification processing of this reproduction output result, and inputting into the following cell.

Third Example

Next, as a fourth example of the invention, the fabricating method of the magnetic element of the structure where two thin lines are crossed as shown in FIG. 14 will be explained.

FIGS. 18A through 18D show planar views showing the manufacture method of the magnetic element of this example.

First, the magnetic film which becomes the reference magnetic part A, the spin transfer intermediate part B, record magnetic part C, the spin transfer intermediate part H, and the reference magnetic part I is formed.

Figure 18A:
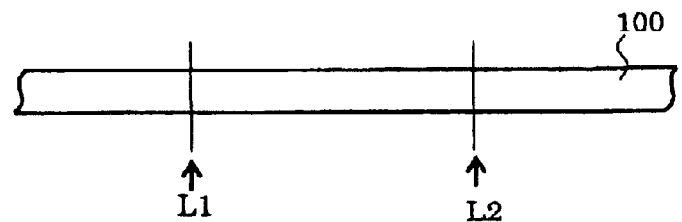
FIGS. 18A through 18D show planar views showing the manufacture method of the magnetic element of the example.
Figure 18B:
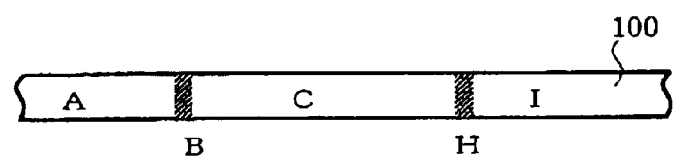

A resist is applied on the film and a thin line mask is formed using EB drawing equipment. And by using a reactive ion etching equipment, portions other than a thin line were etched, and thus, the thin line 100 was formed as shown in FIG. 18A. By performing an electron beam scanning to this thin line on the line of L1 and L2 shown in FIG. 18A, the spin transfer intermediate parts B and H which consist of a crystal deterioration part were formed as shown in FIG. 18B.

Figure 18C:
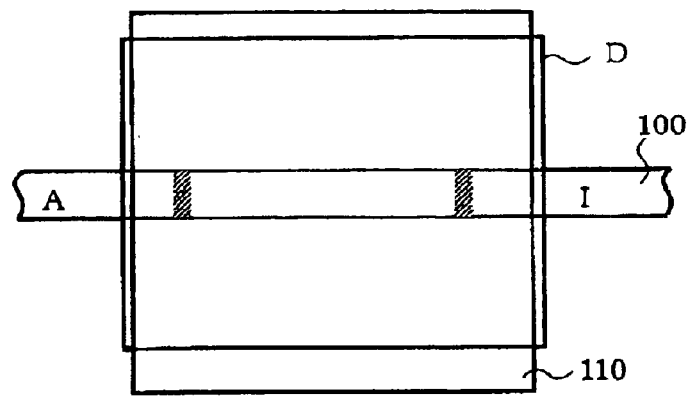
Figure 18D:
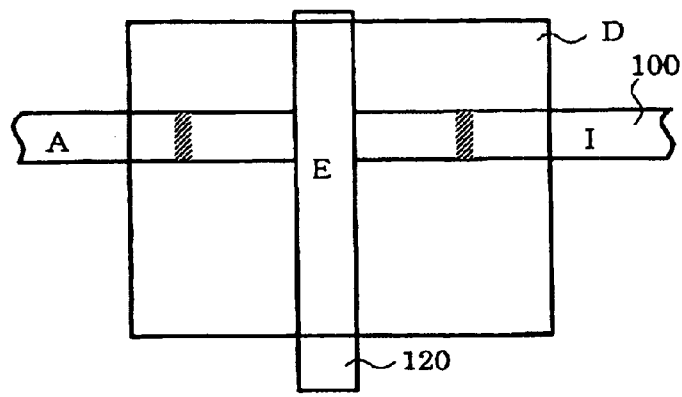

Next, as shown in FIG. 18C, the MR intermediate part D was laminated on the thin line 100. And the magnetic layer 110 for a reference magnetic part E was further formed on it. And this magnetic layer 110 was formed into a thin line by the same method as what was mentioned above about FIG. 18A. At this time, the direction of the thin line 120 was set so that it may become substantially perpendicular to the thin line 100.

In order to make the magnetization directions of the reference magnetic parts A and I anti-parallel, a PtMn pad was directly laminated on the reference magnetic part I. The PtMn pad can alternatively be laminated through a Ru (about 1 nm of thickness) film in the reference magnetic part I. And finally wirings were formed.

By the method explained above, the magnetic logic element which has two crossing thin lines with a width of 50 nm can be formed through the MR intermediate part SP.

Heretofore, embodiments of the invention have been explained in detail with reference to some specific examples. The invention, however, is not limited to these specific examples.

For example, material, shape and thickness of the each layer of the magnetic element according to the invention may be appropriately selected by those skilled in the art within the known techniques to carry out the invention as taught in the specification and obtain equivalent effects.

Also each of these layers of the magnetic element of the invention may be formed as a single layer, or may have a multi-layered structure.

Further, also concerning the magnetic element array according to the invention, those skilled in the art will be able to carry out the invention by appropriately selecting a material or a structure within the known techniques.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A magnetic element comprising:
    a first magnetic reference part including a fist ferromagnetic substance pinned in magnetization substantially in a first direction;
    a second magnetic reference part including a second ferromagnetic substance pinned in magnetization substantially in a second direction;
    a magnetic recording part provided between the first and second magnetic reference parts, and including a third ferromagnetic substance;
    a spin transfer intermediate part provided between the first magnetic reference part and the magnetic recording part; and
    an intermediate part provided between the second magnetic reference part and the magnetic recording part,
    wherein a magnetization of the third ferromagnetic substance being directed in a direction parallel or anti-parallel to the first direction by passing a writing current between the first magnetic reference part and the magnetic recording part, and
    wherein a relative relation between the second direction and the direction of the magnetization of the third ferromagnetic substance being detected by passing a sense current between the second magnetic reference part and the magnetic recording part.

2. A magnetic element according to claim 1, further comprising:
    a switching part connected to the first magnetic reference part; and
    a wiring for writing connected to the magnetic recording part,
    the writing current being passed between the switching part and the wiring for writing while the switching part is turned on, and
    the sense current being passed between the switching part and the second magnetic reference part while the switching part is turned on.

3. A magnetic element according to claim 1, further comprising:
    a first switching part connected to the first magnetic reference part;
    a wiring for writing/reading connected to the magnetic recording part; and
    a second switching part connected to the second magnetic reference part,
    the writing current being passed between the first switching part and the wiring for writing/reading while the first switching part is turned on, and
    the sense current being passed between the second switching part and the wiring for writing/reading while the second switching part is turned on.

4. A magnetic element according to claim 1, wherein a spin-polarized electronic current flows in the magnetic recording part by passing the writing current, and the magnetization of the third ferromagnetic substance is directed in the direction parallel or anti-parallel by the spin-polarized electronic current, and
    a resistance measured by the sense current varies depending on the relative relation between the second direction and the direction of the magnetization of the third ferromagnetic substance.

5. A magnetic element according to claim 1, wherein the intermediate part is made of an electrically insulating material.

6. A magnetic element according to claim 1, wherein a magnetic nanocontact including a portion extending out from the adjoining second magnetic reference part and/or magnetic recording part is formed in the intermediate part.

7. A magnetic element according to claim 1, wherein the third ferromagnetic substance is magnetically softer than the first and second ferromagnetic substances.

8. A magnetic element according to claim 1, further comprising an anti-ferromagnetic layer which applies an exchange magnetic bias to at least one of the first and second ferromagnetic substances.

9. A magnetic element comprising:
    a first magnetic reference part including a first ferromagnetic substance pinned in magnetization substantially in a first direction;
    a second magnetic reference part including a second ferromagnetic substance pinned in magnetization substantially in a second direction;
    an intermediate part provided between the first and second magnetic reference parts,
    a first magnetic recording part provided between the first magnetic reference part and the intermediate part, and including a third ferromagnetic substance;
    a second magnetic recording part provided between the second magnetic reference part and the intermediate part, and including a fourth ferromagnetic substance;
    a first spin transfer intermediate part provided between the first magnetic reference part and the first magnetic recording part; and
    a second spin transfer intermediate part provided between the second magnetic reference part and the second magnetic recording part,
    wherein a magnetization of the third ferromagnetic substance being directed in a direction parallel or anti-parallel to the first direction by passing a first writing current between the first magnetic reference part and the first magnetic recording part, a magnetization of the fourth ferromagnetic substance being directed in a direction parallel or anti-parallel to the second direction by passing a second writing current between the second magnetic reference part and the second magnetic recording part, and a relative relation between the direction of the magnetization of the third ferromagnetic substance and the direction of the magnetization of the fourth ferromagnetic substance being detected by passing a sense current between the first and second magnetic recording parts.

10. A magnetic element according to claim 9, further comprising:

a first switching part connected to the first magnetic reference part;

a second switching part connected to the second magnetic reference part;

a first wiring for writing connected to the first magnetic recording part; and a second wiring for writing connected to the second magnetic recording part, the first writing current being passed between the first switching part and the first wiring for writing while the first switching part is turned on, and the second writing current being passed between the second switching part and the second wiring for writing while the second switching part is turned on.

11. A magnetic element according to claim 9, wherein a first spin-polarized electronic current flows in the first magnetic recording part by passing the writing current, and the magnetization of the third ferromagnetic substance is directed in the direction parallel or anti-parallel by the first spin-polarized electronic current, and wherein a second spin-polarized electronic current flows in the second magnetic recording part by passing the second writing current, and the magnetization of the fourth ferromagnetic substance is directed in the direction parallel or anti-parallel by the second spin-polarized electronic current.

12. A magnetic element according to claim 9, wherein a resistance measured by the sense current varies depending on the relative relation between the direction of the magnetization of the third ferromagnetic substance and the direction of the magnetization of the fourth ferromagnetic substance.

13. A magnetic element according to claim 9, wherein the intermediate part is made of an electrically insulating material.

14. A magnetic element according to claim 9, wherein a magnetic nanocontact including a portion extending out from the adjoining first magnetic recording part and/or the second magnetic recording part is formed in the intermediate part.

15. A magnetic element according to claim 9, wherein the third and fourth ferromagnetic substances are magnetically softer than the first and second ferromagnetic substances.

16. A magnetic element according to claim 9, further comprising an anti-ferromagnetic layer which applies an exchange magnetic bias to at least one of the first and second ferromagnetic substances.

17. A magnetic element array comprising:

a plurality of magnetic elements; and a selector which selects one of the magnetic elements and passes a writing current or a sense current, each of the magnetic elements having:

a first magnetic reference part including a first ferromagnetic substance pinned in magnetization substantially in a first direction;

a second magnetic reference part including a second ferromagnetic substance pinned in magnetization substantially in a second direction;

a magnetic recording part provided between the first and second magnetic reference parts, and including a third ferromagnetic substance;

a spin transfer intermediate part provided between the first magnetic reference part and the magnetic recording part; and an intermediate part provided between the second magnetic reference part and the magnetic recording part, wherein a magnetization of the third ferromagnetic substance being directed in a direction parallel or anti-parallel to the first direction by passing a writing current between the first magnetic reference part and the magnetic recording part, and a relative relation between the second direction and the direction of the magnetization of the third ferromagnetic substance being detected by passing a sense current between the second magnetic reference part and the magnetic recording part.

18. A magnetic element array according to claim 17, further comprising:

a switching part connected to the first magnetic reference part; and a wiring for writing connected to the magnetic recording part, the writing current being passed between the switching part and the wiring for writing while the switching part is turned on, and the sense current being passed between the switching part and the second magnetic reference part while the switching part is turned on.

19. A magnetic element array comprising:

a plurality of magnetic elements; and a selector which selects one of the magnetic elements and passes a writing current or a sense current, each of the magnetic elements having:

a first magnetic reference part including a first ferromagnetic substance pinned in magnetization substantially in a first direction;

a second magnetic reference part including a second ferromagnetic substance pinned in magnetization substantially in a second direction;

an intermediate part provided between the first and second magnetic reference parts, a first magnetic recording part provided between the first magnetic reference part and the intermediate part, and including a third ferromagnetic substance;

a second magnetic recording part provided between the second magnetic reference part and the intermediate part, and including a fourth ferromagnetic substance;

a first spin transfer intermediate part provided between the first magnetic reference part and the first magnetic recording part; and a second spin transfer intermediate part provided between the second magnetic reference part and the second magnetic recording part, a magnetization of the third ferromagnetic substance being directed In a direction parallel or anti-parallel to the first direction by passing a first writing current between the first magnetic reference part and the first magnetic recording part, a magnetization of the fourth ferromagnetic substance being directed in a direction parallel or anti-parallel to the second direction by passing a second writing current between the second magnetic reference part and the second magnetic recording part, and a relative relation between the direction of the magnetization of the third ferromagnetic substance and the direction or the magnetization of the fourth ferromagnetic substance being detected by passing a sense current between the first and second magnetic recording parts.

20. A magnetic element array according to claim 19, further comprising:

a first switching part connected to the first magnetic reference part;

a second switching part connected to the second magnetic reference part;

a first wiring for writing connected to the first magnetic recording part; and a second wiring for writing connected to the second magnetic recording part, the first writing current being passed between the first switching part and the first wiring for writing while the first switching part is turned on, and the second writing current being passed between the second switching part and the second wiring for writing while the second switching part is turned on.

* * * * *

UNITED STATES PATENT AND TRADEMARK OFFICE
CERTIFICATE OF CORRECTION

PATENT NO. : 6,906,949 B1
DATED : June 14, 2005
INVENTOR(S) : Nakamura et al.

It is certified that error appears in the above-identified patent and that said Letters Patent is hereby corrected as shown below:

<u>Title page,</u>
Item [30], should read
-- [30]      Foreign Application Priority Data
     Mar. 29, 2002    (JP) ................. 2002-096345 --.

Signed and Sealed this

Twenty-third Day of August, 2005

JON W. DUDAS
*Director of the United States Patent and Trademark Office*